United States Patent [19]

Bozler et al.

[11] 4,197,141

[45] Apr. 8, 1980

[54] METHOD FOR PASSIVATING IMPERFECTIONS IN SEMICONDUCTOR MATERIALS

[75] Inventors: Carl O. Bozler, Sudbury; John C. C. Fan, Chestnut Hill, both of Mass.

[73] Assignee: Massachusetts Institute of Technology, Cambridge, Mass.

[21] Appl. No.: 873,987

[22] Filed: Jan. 31, 1978

[51] Int. Cl.² .................... H01L 31/04; C25D 5/00
[52] U.S. Cl. .................. 136/89 TF; 204/325;
204/38 R; 204/56 R; 204/129.1; 204/130;
204/140; 428/195; 428/203; 357/30; 357/59
[58] Field of Search ........ 136/89 CR, 89 SG, 89 GA,
136/89 ST, 89 CD, 89 TF, 89 CC, 89 TC;
204/129.1, 130, 325, 140, 141.5, 35 R, 56 R, 15,
38 R; 357/30, 59; 428/195, 203

[56] References Cited

U.S. PATENT DOCUMENTS

| | | | |
|---|---|---|---|
| 2,902,419 | 9/1959 | Carasso et al. | 204/32 S |
| 2,958,633 | 11/1960 | Claussen | 204/32 S |
| 2,963,411 | 12/1960 | Scott | 204/129.3 |
| 3,261,074 | 7/1966 | Beauzee | 29/25.3 |
| 3,888,697 | 6/1975 | Bogus et al. | 136/89 |
| 3,929,529 | 12/1975 | Poponiak | 148/191 |
| 3,982,265 | 9/1976 | Johnston, Jr. | 357/30 |
| 3,990,914 | 11/1976 | Weinstein et al. | 136/89 |
| 4,064,522 | 12/1977 | Shaw et al. | 357/16 |
| 4,082,602 | 4/1978 | Chang et al. | 156/627 |

OTHER PUBLICATIONS

H. J. Hovel et al., "Anodized GaAs Solar Cells", *IBM Tech. Disc. Bull.*, vol. 19, p. 2808, (1976).

*Primary Examiner*—Aaron Weisstuch
*Attorney, Agent, or Firm*—Arthur A. Smith, Jr.; David E. Brook

[57] ABSTRACT

A method of passivating imperfections, such as grain boundaries and/or dislocations, in semiconductor materials is disclosed which comprises selectively passing electrical current along the imperfections by employing the semiconductor material as an electrode in an electrolytic cell.

17 Claims, 7 Drawing Figures

METHOD FOR PASSIVATING IMPERFECTIONS IN SEMICONDUCTOR MATERIALS

GOVERNMENT SUPPORT

This invention was partially supported by Grant No. 19628-76-C-0002 from the United States Air Force.

BACKGROUND OF THE INVENTION

1. Field of the Invention

This invention is in the field of semiconductor materials.

2. Description of the Prior Art

Photovoltaic cells have been developed which generate electrical energy directly from sunlight. Typically, such cells have been fabricated from semiconductor materials containing a rectifying junction, such as a p-n junction or a Schottky barrier.

A number of problems have been encountered, however, in attempts to produce photovoltaic cells which would have wide acceptance for use in producing energy from sunlight. One of the problems has been the cost of producing such cells, which has heretofore been relatively high. In fact, the cost of photovoltaic cells has generally been considered to be severely limiting except in applications where cost is not a controlling factor, such as in space applications or generation of power in remote areas.

The high cost of producing photovoltaic cells is due in large measure to the requirement for near crystal perfection and to the elaborate procedures involved in semiconductor wafer preparation. In regard to crystal perfection, it has almost universally been widely believed that only single crystal semiconductor materials could produce reasonable cell efficiencies. Polycrystalline semiconductor materials, on the other hand, have generally been unacceptable because they invariably have certain imperfections. Among these imperfections are the intersections between crystals, which are known as grain boundaries. Often, polycrystalline semiconductors also contain line imperfections within the crystals, which are known as dislocations. Still other possible imperfections include clusters, inclusions, impurities, etc.

Both grain boundaries and dislocations are known to possess properties which are different from the bulk crystal properties, including their electrical properties. Often, their resistance is lower than that of the bulk crystal, which produces a shorting effect through the polycrystalline semiconductor material when such materials are used in photovoltaic cells. The result is a low open circuit voltage which produces a concomittant reduction in photovoltaic cell efficiency.

Diffusion of impurities, such as a contact material, can also occur more rapidly into and along grain boundaries than into the bulk of semiconductor materials. Thus, the grain boundaries have a tendency to deteriorate more quickly than the bulk material itself.

Grain boundaries and dislocations additionally produce an overall degradation in semiconductor diode performance.

Because of the problems encountered with polycrystalline materials, they have not found wide acceptance for use in photovoltaic cells. Furthermore, those few photovoltaic cells which have employed polycrystalline materials have heretofore had much lower cell efficiencies than corresponding cells based upon single crystal semiconductor materials. Thus, although polycrystalline materials can be produced relatively inexpensively compared to single crystal materials, they have not been employed to any great extent in photovoltaic cells and, even when employed, have produced unsatisfactory photovoltaic cell efficiencies.

SUMMARY OF THE INVENTION

This invention relates to the passivation of imperfections in semiconductor materials. Such imperfections include grain boundaries and dislocations, which are typically present in polycrystalline semiconductor materials. Passivation, as used herein, means a treatment which produces a significant reduction, or the total elimination, of the deleterious properties caused by imperfections such as grain boundaries and dislocations when semiconductor materials containing such imperfections are employed in electronic devices, particularly photovoltaic cells.

Passivation is achieved according to this invention by preferentially passing electrical current along the grain boundaries, dislocations, or other imperfections, in semiconductor materials. This preferential passage of electrical current is achieved in an electrolytic cell wherein the semiconductor material to be passivated is employed as the anode or cathode. By careful selection and consideration of such parameters as the electrolyte, the voltage applied, the semiconductor material to be passivated, etc., conditions can be achieved under which the desired passivation occurs.

In some cases, for example, passivation is accomplished by the selective deposition of insulating caps at the points where semiconductor imperfections intersect a surface of the material. In other cases, passivation can be achieved be depositing non-insulating caps which can subsequently be converted to insulating caps by oxidation, nitration, etc. Additionally, passivation can be achieved in some cases by etching areas where current is selectively passed along semiconductor imperfections. Of course, a combination of any of these techniques could also be used to achieve the desired passivation.

After passivation, additional layers of material, including conductive coatings, may be applied over the semiconductor material's surface to produce an electronic device. In such a device, the deleterious properties normally caused by the presence of grain boundaries, dislocations, etc., including shorting out, will be entirely obviated or substantially reduced.

A significant advantage of this method is its selectivity. As is known, not all imperfections have lower electrical resistance than the bulk crystal. However, current will preferentially flow only along those having such low resistance compared to the bulk crystal. Because of this, the method is selective to those areas of the material which cause deleterious properties when the material is employed in electronic devices.

Thus, some of the major obstacles to the wide usage of polycrystalline semiconductor materials in electronic devices, such as photovoltaic cells, are obviated by the method described herein. Relatively high efficiency electronic devices, including photovoltaic devices, can be fabricated from polycrystalline materials more inexpensively and simply than would be the case with corresponding devices requiring single crystal semiconductor materials.

DESCRIPTION OF PREFERRED EMBODIMENTS

Preferred embodiments of this invention will now be described in more detail with reference to the Figures.

Figure 1:
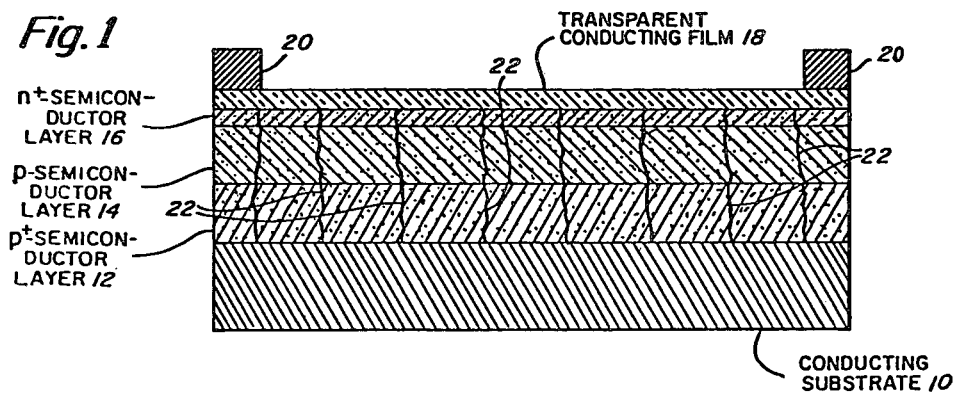
FIG. 1 is a cross-sectional view of a photovoltaic device employing polycrystalline semiconductor materials suitably doped to provide a rectifying junction and containing grain boundaries in the semiconductor materials.

FIG. 1 illustrates a photovoltaic device, based upon a rectifying junction formed in polycrystalline semiconductor material. The device has a conducting substrate 10, which may be formed from a material such as graphite, molybdenum or tungsten. In some cases, the semiconductor itself can serve as a conducting substrate if it is appropriately doped. Successive layers 12, 14, and 16 of p+-semiconductor material, p semiconductor material, and n+-semiconductor material, respectively, are deposited upon conducting substrate 10. Semiconductor layers 12, 14, and 16 can be conveniently formed from gallium arsenide, for example, suitably doped to provide the desired electrical properties. Thus, semiconductor layer 12 might be gallium arsenide suitably doped with p-dopants such as zinc, cadmium, beryllium or magnesium to a carrier level of $10^{18}$ or above; semiconductor layer 14 might be a gallium arsenide layer suitably doped with p-dopants to a carrier level of $10^{16}$–$10^{17}$; and n+-semiconductor layer 16 might be gallium arsenide suitably doped with n-dopants such as sulfur, selenium or silicon to a carrier concentration of $10^{17}$ or above. Layer 12 is deposited, of course, to form an ohmic contact with substrate 10.

Transparent conducting film 18 is deposited on n+-semiconductor layer 16 in a manner suitable for producing an ohmic contact between film 18 and layer 16. This can be done, for example, by depositing materials such as antimony-doped tin oxide or tin-doped indium oxide by chemical spray techniques; rf, d.c. or ion beam sputtering; or thermal evaporation. Typically, such films have a thickness of less than one micron, a resistivity of about $2-3 \times 10^{-4}$ ohm-cm, and a visible transmission of about 80% or more. This film serves to reduce the lateral or sheet resistance of the device.

Electrical contacts 20 are then applied and might be formed from metals such as gold, aluminum, silver, copper, or other materials capable of making ohmic contact with transparent conducting film 18.

Grain boundaries 22 extend through each of semiconductor layers 12, 14 and 16. Such grain boundaries might originate in p+-semiconductor layer 12, which could be formed from polycrystalline material, or in either of layers 14 or 16. In fact, such imperfections might even originate in substrate 10. It is known that such imperfections propagate through contiguous layers, especially when they are grown epitaxially to each other. The result is that when voltage is applied, shorting of the device can occur along grain boundaries 22 since the resistance of grain boundaries 22 can be significantly less than that of the bulk semiconductor layers 12, 14 and 16. When such shorting occurs, the open circuit voltage across the device is significantly less than would be the case if such grain boundaries were not present, and this results in a much lower photovoltaic conversion.

Figure 2:
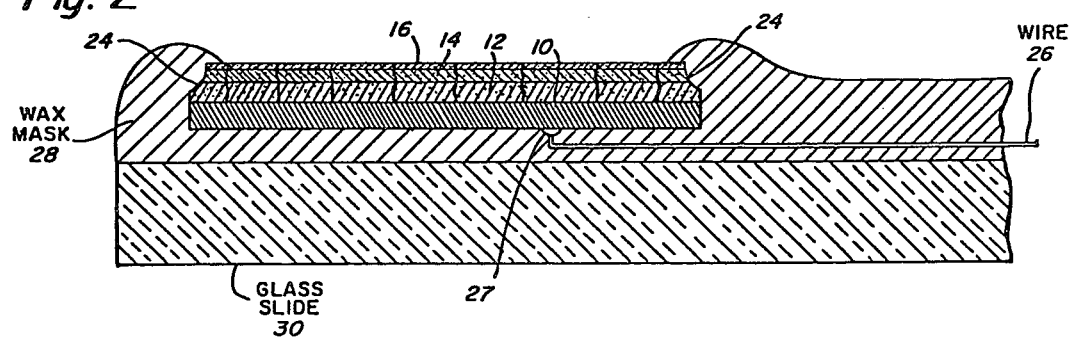
FIG. 2 is a cross-sectional view of a semiconductor device which has been prepared for use as the anode in an electrolytic cell so that current can be preferentially passed along grain boundaries contained in the semiconductor material.

FIG. 2 illustrates the preparation of a polycrystalline semiconductor device, such as that formed from layers 12, 14 and 16, for immersion in an electrolytic cell. To minimize the chance of electrical leakage around the device, the edges of layers 12 and 14 are etched to form recesses 24. Any suitable etch, such as, for example, a 5/1/1, by volume, solution of concentrated $H_2SO_4$/concentrated $H_2O_2$/$H_2O$ can be used for this purpose. After etching, the semiconductor layer edges, an electrical lead, such as wire 26, is attached to the conductive substrate 10 to form an ohmic contact 27.

Subsequently, the edges of the polycrystal semiconductor layers 12, 14 and 16, as well as the exposed surface of conducting substrate 10, are masked. This can conveniently be done by embedding the device in an electrically insulating wax 28, such as rosin wax. Other suitable masking material would include Apiezon wax, crystal bond or shellac. The embedded wafer is then mounted on glass slide 30 for ease of handling.

Figure 3:
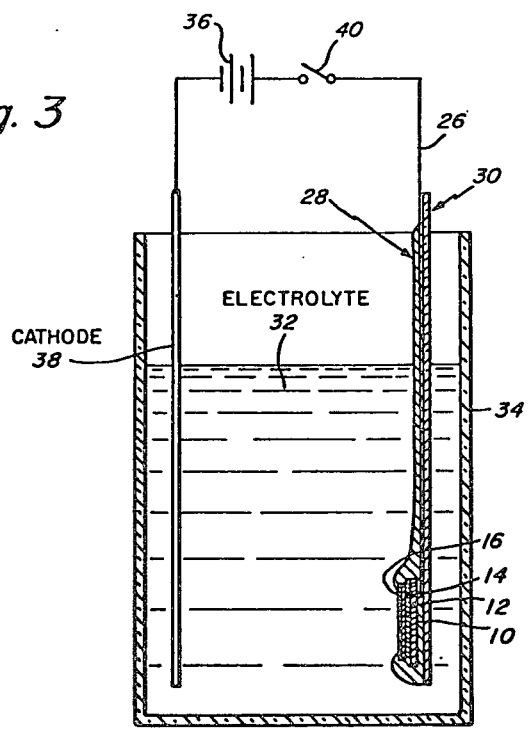
FIG. 3 is an elevational view illustrating an electrolytic cell employing the electronic device, prepared as in FIG. 2, as an anode.

FIG. 3 illustrates an electrolytic cell containing the device prepared as in FIG. 2 as an anode. The electrolytic cell is formed by placing electrolyte 32 in a suitable vessel 34. The polycrystalline semiconductor device, prepared as in FIG. 2, is inserted into the electrolyte and the electrical wire lead 26 is electrically connected to the positive side of a voltage source, such as battery 36, or a current source.

A cathode 38, which may be a platinum electrode, is also immersed in electrolyte 32 and connected to the negative side of battery 36. Switch 40 is provided to activate or deactivate the cell. When switch 40 is closed, current flows selectively along imperfections in the device where the resistance is much less than in the bulk of layers 12, 14 and 16.

Selective current flow requires careful selection of the voltage applied, of course. This voltage must be sufficient to provide the required degree of deposition, etching, oxidation, etc., in a reasonable amount of time. On the other hand, it should not exceed the barrier height of the barrier used to provide reverse biasing, and therefore, selective passivation. In this regard, a number of different barriers may be used, including the interface between the electrolyte and semiconductor; a p-n junction within the device; or Shottky barrier within the device. This upper limit on the voltage might be referred to as the reverse breakdown voltage of the device.

By proper selection and control over the operating parameters, such as the electrolyte, voltage applied, use of polycrystalline semiconductor as anode or cathode, etc., passivation can be achieved by creation of an insulating oxide coating, deposition of a material which can be converted to an insulating coating, selective etching, or any combination.

For example, when a polycrystalline gallium arsenide semiconductor is used as an anode, an electrolyte comprising a 50/50, by volume, solution of water/hydrogen peroxide can be used to convert the gallium arsenide to an insulating oxide at the intersection of grain boundaries with the surface of the material. On the other hand, an electrolyte of 40% sodium hydroxide in water would be suitable for selective etching.

Alternatively, the semiconductor material can be used as a cathode, in which case a number of metals can be deposited. For example, aluminum could be deposited from a solution of aluminum chloride, ethyl ether and lithium aluminum hydride; copper could be deposited from a solution of copper cyanide, potassium cyanide, potassium fluoride; nickel could be deposited from a solution of hydrogen fluoride, $2NiCO_3 \cdot 3Ni(OH)_2 \cdot 4H_2O$ and citric acid; and chromium could be deposited from a solution of chromic oxide, sulfuric acid and potassium fluoride. Similarly, a solution of chromic oxide, bismuth carbonate, potassium silicon hexafluoride ($K_2SiF_6$) could be used to deposit an insulating oxide directly.

In all cases, the electrolyte is chosen so that no significant amounts of deposition, etching, conversion, etc. occur before current is selectively passed through the device. This prevents attack or damage to the bulk of the device.

This invention can be further illustrated by the following specific exemplification.

A commercially available semiconductor wafer of high purity polycrystalline gallium arsenide, zinc doped to be P+($10^{18}$ carriers/cm$^3$), was employed. This wafer had a crystallite grain size of approximately 1-5 mm and a thickness of 0.020".

Initially, the wafer was polished with a standard Clorox polish and residual damage was removed with a sulfuric acid/hydrogen peroxide/water etch. After polishing, the wafer was placed in an epitaxial reactor of the type previously described by Bozler. See, Bozler, C. O., *Solid State Research Report*, Lincoln Laboratories, M.I.T., Vol. 2, p 52 (1975). An epitaxial layer of lightly doped ($10^{16}$ carriers/cm$^3$) p-type gallium arsenide was then deposited with zinc dopant to a thickness of 2 $\mu$m followed by application of an n layer formed from sulfur-doped gallium arsenide ($10^{17}$ carriers/cm$^3$) to a thickness of 0.5 $\mu$m. Thus, the epitaxial gallium arsenide layers formed a p-n junction about 0.5 $\mu$m below the top surface. It was noted that grain boundaries originating in the original polycrystalline gallium arsenide wafer propagated through the subsequently deposited gallium arsenide layers.

An ohmic contact consisting of an indium-zinc alloy was applied to the back surface of the p+wafer and, on the n surface, a 1000 Å layer of silicon dioxide was pyrolytically deposited. An array of 12 mil. diameter holes on 30 mil. centers was photolithographically formed through the silicon dioxide layer, and these 12 mil. diameter holes reexposed circular areas of the n gallium arsenide surface. To prevent current leakage at the outside edges of the wafer, the wafer edges were etched using the sulfuric acid/hydrogen peroxide/water etch.

Approximately one-half of the perforated silicon dioxide surface was masked with rosin wax, and an electrical lead was soldered to the indium-zinc ohmic contact on the other side. Rosin masking wax was also applied to all exterior surfaces except the remaining exposed perforated silicon dioxide surface.

The prepared device was then placed in a beaker containing an electrolyte solution formed by mixing 100 cc of water with 3 grams of tartaric acid, adjusting the pH with ammonium hydroxide to a value of 6.2, and then adding 200 cc of propylene glycol. The electrical lead from the device was then connected to a voltage source of about 10 volts. A platinum electrode was inserted into the electrolyte and was also connected to the voltage source. Thus, the prepared device served as an anode whereas the platinum electrode served as a cathode in the cell. Since the barrier was less than 10 volts at the areas where the grain boundaries and electrolyte contacted each other, but greater than 10 volts at the areas where the bulk crystals and electrolyte contacted, current passed selectively through the grain boundaries. Current flow was maintained until anodization caps approximately 200 Å thick had formed over the grain boundaries where they intersected the device surface.

After this, the passivated device was removed from the electrolytic cell and all masking wax was stripped from its surfaces. A gold layer of about 1000–2000 Å was sputtered onto the silicon dioxide layer and on the GaAs in openings and a mask formed from an array of 22-mil diameter circles on 30-mil centers was photolithographically applied concentrically over the original 12-mil diameter holes. The gold layer was etched away using Technistrip gold etch at all surface areas except those protected by the array of 22-mil diameter masking circles. Exposed silicon dioxide layer was also etched using buffered hydrochloric acid. The hydrogen peroxide/sulfuric acid/water etch was then used to etch away 2 $\mu$m of n gallium arsenide, leaving an array of electrically isolated mesas each of which was approximately 2 $\mu$m high on the front side of the device. The device was annealed for about 1 second at 350° C. to improve the ohmic contact between the sputtered gold layer and the n gallium arsenide layer.

Figure 4:
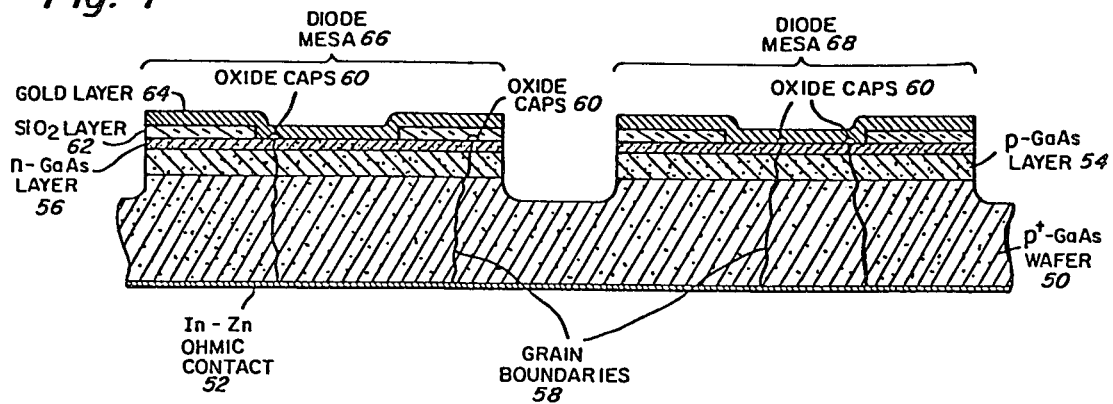
FIG. 4 is a partial exploded view of diode mesas formed on the surface of an electronic device after passivation of the polycrystalline semiconductor has been completed.

The device produced is illustrated schematically in FIG. 4. Therein, the original gallium arsenide wafer 50 is illustrated with the indium-zinc ohmic contact 52 deposited on one surface. On its other surface, successive layers 54 and 56 of p+-gallium arsenide and n-gallium arsenide were deposited. Grain boundaries 58, originally present in gallium arsenide wafer 50, propagated through successively deposited layers 54 and 56. Passivation of the grain boundaries 58 was achieved by selective deposition (anodization) of oxide caps 60 at the intersection of grain boundaries 58 and the surface of layer 56. The remaining portions of silicon oxide layer 62 and gold layer 64 are also shown. The device of FIG. 4 is shown with two resulting mesas 66 and 68.

Figure 5:
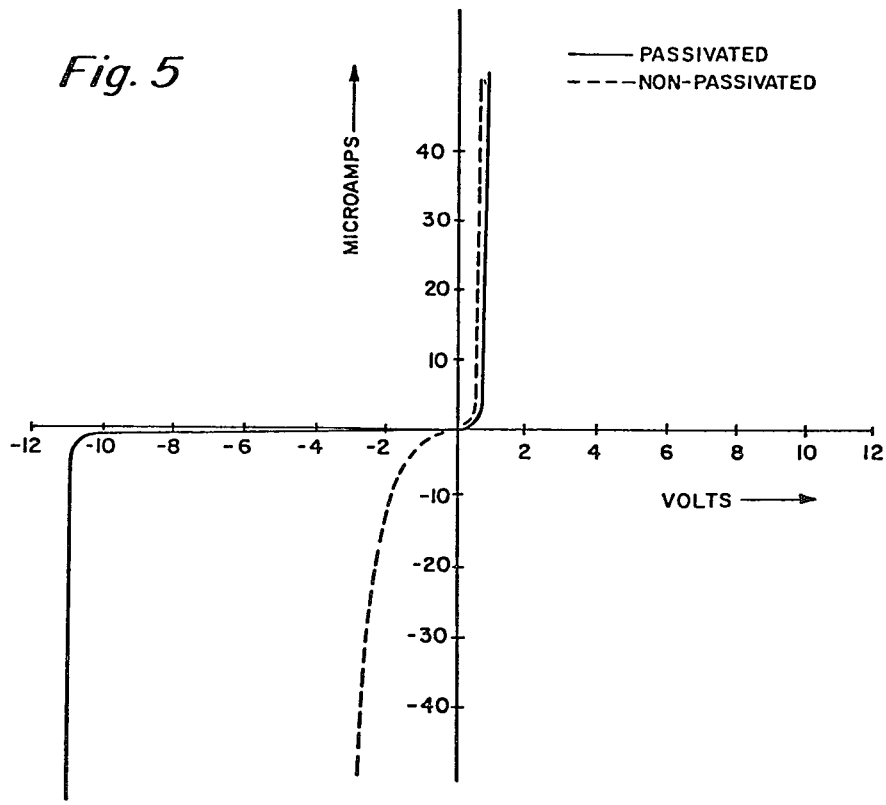
FIG. 5 is a plot of the electrical characteristics (I-V) of diode mesas as illustrated in FIG. 4.

The current-voltage characteristics of the resulting device were measured. All diodes formed in anodized areas of the wafer behaved in a superior manner to those formed in non-anodized areas of the wafer. Diodes in non-anodized areas displayed voltage leakage behavior typical of diodes heretofore formed from polycrystalline semiconductor wafers. A comparison between typical diodes from anodized and non-anodized areas is shown in FIG. 5. This evidences that selective anodization was achieved and served to passivate the grain boundaries at the surface of the semiconductor material.

Figure 6:
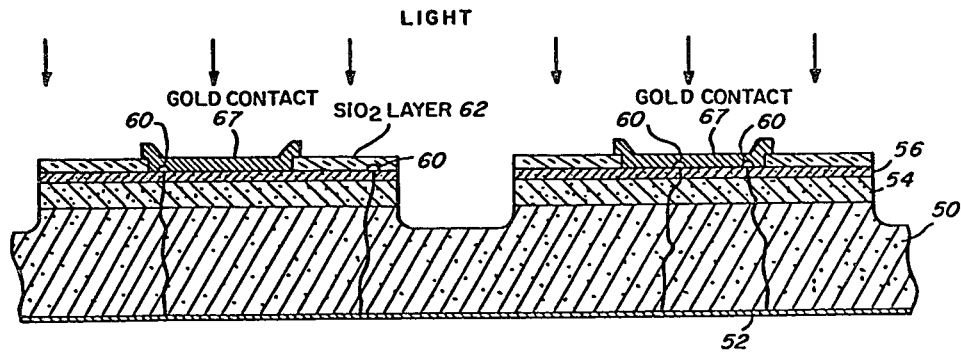
FIG. 6 is a cross-sectional view of a photovoltaic cell formed from diode mesas as illustrated in FIG. 4.

A device prepared in this way was used to fabricate a photovoltaic cell. An etch mask was photolithographically applied over the device of FIG. 4 and a array of 14-mil diameter circles on 30-mil centers were applied concentrically. The wafer was then etched using a gold etch to remove gold exposed on the top of each diode leaving behind gold dots of 14 mils. Thus, an array of small photovoltaic cells was formed, as illustrated in FIG. 6. As can be seen, gold contacts 67 were formed by etching away gold layer 64 at all are as except where the mask was applied.

Figure 7:
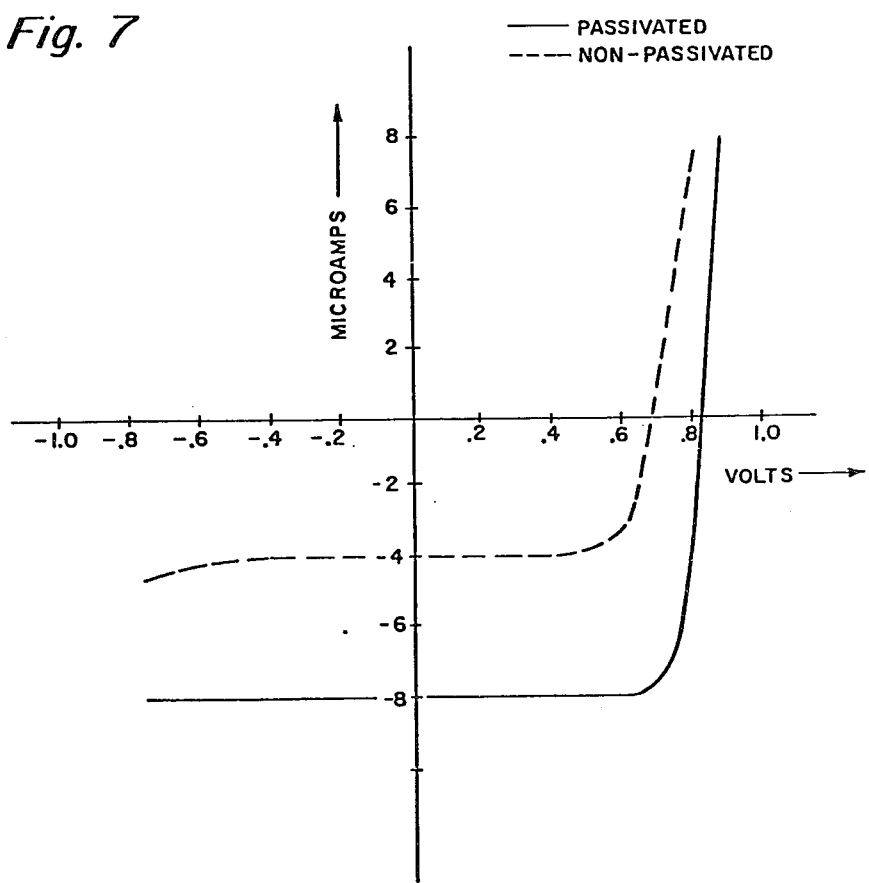
FIG. 7 is a plot of the electrical characteristics (I-V) of a photovoltaic cell as illustrated in FIG. 6, under simulated AM1 illumination.

The array was illuminated with simulated solar radiation, AM1. Current-voltage (I–V) characteristics were measured with and without illumination, and are shown in FIG. 7. The photovoltaic cells formed in anodized areas exhibited light induced current and higher open circuit voltage, and in general, were much higher-efficiency devices than the corresponding cells formed in non-anodized areas.

Those skilled in the art will recognize, or be able to ascertain using no more than routine experimentation, many equivalents to the specific embodiments of the invention described herein. Such equivalents are intended to be encompassed by the following claims.

What is claimed is:

1. A method for passivating imperfections in a semiconductor material, comprising:
   a. employing said semiconductor material as an anode or cathode in an electrolytic cell;
   b. applying a voltage across said cell which is sufficient to establish selective current flow along said imperfections; and,
   c. maintaining selective current flow along said imperfections until (1) the desired passivation is achieved or (2) sufficient material has been deposited or etched to provide the desired passivation upon subsequent treatment.

2. A method of claim 1 wherein said semiconductor material comprises a polycrystalline semiconductor material containing grain boundaries.

3. A method of claim 2 wherein the voltage applied across said cell is below the reverse breakdown voltage.

4. A method of claim 3 wherein passivation is achieved by the electrodeposition of electrically insulating caps at the intersection of said grain boundaries with the surface of said polycrystalline semiconductor material.

5. A method of claim 3 wherein passivation is achieved by etching the semiconductor material at the intersection of said grain boundaries with the surface of said polycrystalline semiconductor material.

6. A method of claim 3 wherein passivation is achieved by electrodepositing an oxidizable material at the intersections of said grain boundaries with the surface of said polycrystalline semiconductor material and subsequently oxidizing said oxidizable material.

7. A method of claim 6 wherein said oxidizable material comprises a metal.

8. A method of claim 7 wherein said metal is selected from aluminum, copper, nickel, and chromium.

9. A passivated polycrystalline semiconductor material produced by the process of claim 2.

10. A passivated polycrystalline semiconductor material of claim 9 including a transparent conductive film to lower the lateral resistance thereof.

11. A photovoltaic cell employing a passivated polycrystalline semiconductor material produced according to the process of claim 2.

12. A photovoltaic cell of claim 11 including an overlying transparent conductive film to lower the lateral resistance thereof.

13. A method of claim 1 including the additional step of applying a transparent conductive film to said passivated semiconductor material to lower the lateral resistance thereof.

14. A method of claim 13 wherein said semiconductor material comprises polycrystalline semiconductor material.

15. A method of claim 14 wherein said polycrystalline semiconductor material comprises gallium arsenide.

16. A method of claim 15 wherein said transparent conductive film comprises antimony-doped tin oxide or tin-doped indium oxide.

17. A method of claim 16 wherein said transparent conductive film has a thickness of less than about one micron.

* * * * *